United States Patent
Lee et al.

(10) Patent No.: US 9,461,648 B1
(45) Date of Patent: Oct. 4, 2016

(54) POWER CONTROL DEVICE

(71) Applicant: SK hynix Inc., Icheon-si Gyeonggi-do (KR)

(72) Inventors: Hyeng Ouk Lee, Yongin-si (KR); Seung Chan Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/818,744

(22) Filed: Aug. 5, 2015

(30) Foreign Application Priority Data

Apr. 10, 2015 (KR) .................. 10-2015-0050989

(51) Int. Cl.
*H03K 19/0185* (2006.01)
*H03K 19/003* (2006.01)

(52) U.S. Cl.
CPC ..... *H03K 19/018507* (2013.01); *H03K 19/00315* (2013.01)

(58) Field of Classification Search
CPC ............... H03K 19/00315; H03K 19/0175; H03K 19/0185; H03K 19/018507; H03K 19/018514; H03K 19/018521; H03K 19/018528
USPC ............................. 326/80, 81; 327/198, 333
See application file for complete search history.

(56) References Cited

U.S. PATENT DOCUMENTS

| 5,751,643 A | * | 5/1998 | Lines | .................. | G11C 11/4085 365/189.11 |
| 2008/0238514 A1 | * | 10/2008 | Kim | .................. | G06F 1/08 327/212 |

OTHER PUBLICATIONS

U.S. Appl. No. 14/517,308, filed Oct. 17, 2014, SK Hynix Inc.

* cited by examiner

*Primary Examiner* — William Hernandez
(74) *Attorney, Agent, or Firm* — William Park & Associates Ltd.

(57) ABSTRACT

A power control is disclosed, which relates to a technology for stably performing a power ramp-up operation during a power-up operation of an integrated circuit (IC) having heterogeneous power. The power control device includes: an amplifier configured to perform level shifting of a second power-supply voltage level to a first power-supply voltage level according to an input signal during an initial power-up operation section, and output the level-shifted output signal; an initialization unit configured to set an output signal level of the amplifier to the first power-supply voltage level according to a control signal during the initial power-up operation section, and output the first power-supply voltage level; and a latch unit configured to latch an output signal of the initialization unit according to the second power-supply voltage level during the initial power-up operation section.

20 Claims, 5 Drawing Sheets

POWER CONTROL DEVICE

CROSS-REFERENCE TO RELATED APPLICATION

This application claims priority based upon Korean patent application No. 10-2015-0050989, filed on Apr. 10, 2015, the disclosure of which is hereby incorporated in its entirety by reference herein.

BACKGROUND OF THE INVENTION

Embodiments of the invention relate to a power control device, and more particularly to a technology for stably performing a power ramp-up operation during a power-up operation of an integrated circuit (IC) having heterogeneous power (i.e., different power-supply voltages).

Generally, a power-up signal generation circuit of a semiconductor device performs initialization of the semiconductor device. Meanwhile, the power-up signal generation circuit receives an external voltage (VDD) from an external part so as to operate the semiconductor device. The external voltage (VDD) level starts from 0V and gradually increases to a target voltage level along a predetermined slope.

In this case, when all circuits of the semiconductor device directly receive the external voltage (VDD), initialization of a specific node and supply of stable power are needed. The semiconductor device includes a power-up signal generation circuit configured to enable a power-up signal, so that the enabled power-up signal is supplied to individual circuits after the external voltage (VDD) reaches a stable voltage level. The semiconductor device is initialized by the power-up operation.

BRIEF SUMMARY

In accordance with an embodiment of the invention, a power control device includes an amplifier configured to perform level shifting of a second power-supply voltage level to a first power-supply voltage level according to an input signal during an initial power-up operation section, and to output the level-shifted output signal. The power control device also includes an initialization unit configured to set an output signal level of the amplifier to the first power-supply voltage level according to a control signal during the initial power-up operation section, and to output the first power-supply voltage level. The power control device also includes a latch unit configured to latch an output signal of the initialization unit according to the second power-supply voltage level during the initial power-up operation section.

In an embodiment, a power control device may include an amplifier configured to use a first power-supply voltage and a second power-supply voltage, perform a level shifting of the second power-supply voltage, and output a resultant signal shifted to a level of the first power-supply voltage. The power control device may also include an initialization unit including a pull-up element electrically coupled between an input terminal of the first power-supply voltage and an input terminal of the amplifier and configured to receive a control signal by detecting the level of the first power-supply voltage. The power control device may also include a latch unit configured to latch an output signal of the initialization unit extended to a time section arranged before the second power-supply voltage is ramped up.

DETAILED DESCRIPTION

Figure 1:
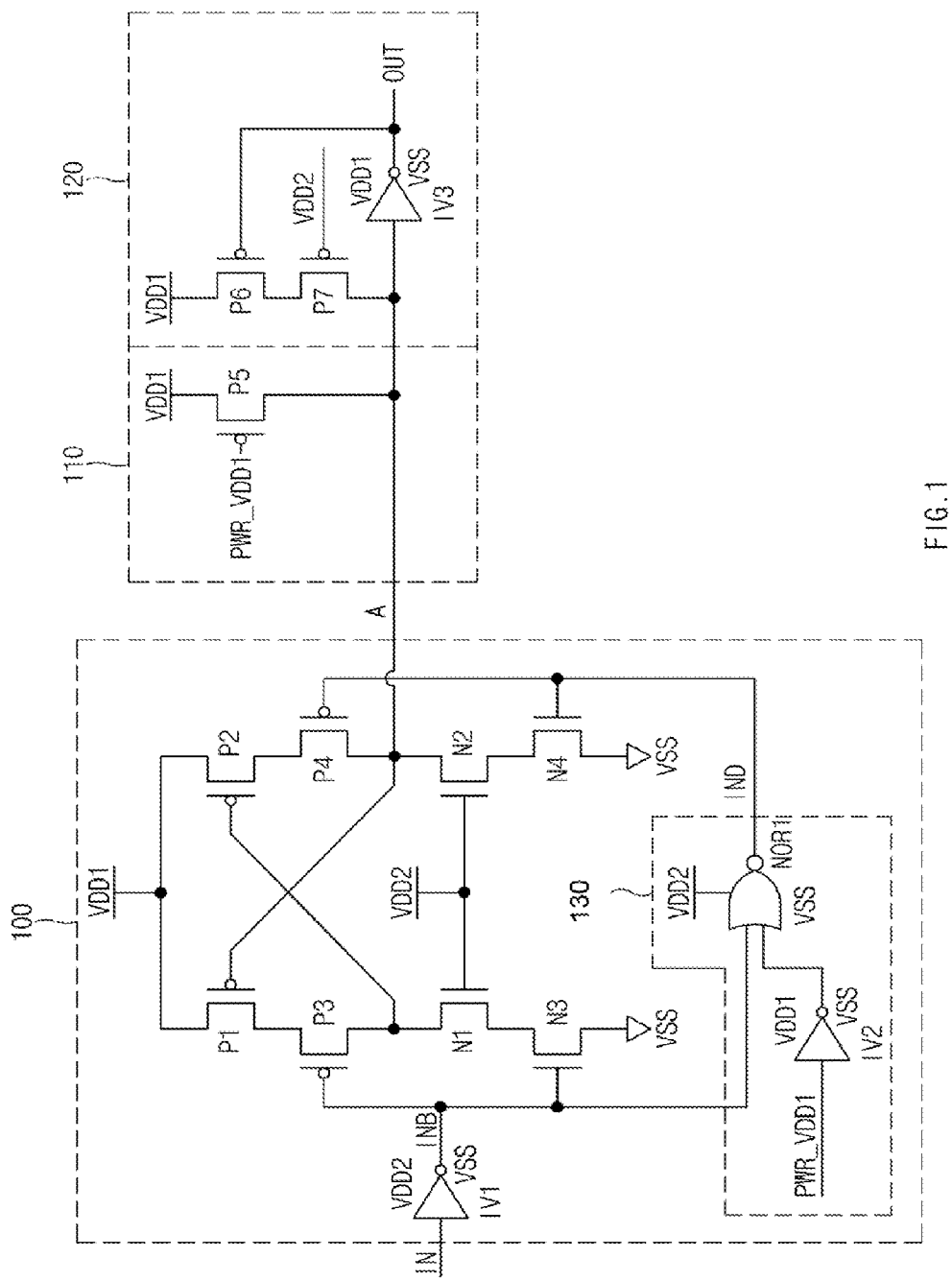
FIG. 1 is a circuit diagram illustrating a power control device according to an embodiment of the invention.

Reference will now be made in detail to embodiments of the invention, examples of which are illustrated in the accompanying figures. Wherever possible, the same reference numbers are used throughout the figures to refer to the same or like portions. In the following description of the invention, a detailed description of related known configurations or functions incorporated herein may be omitted for clarity of the subject matter of the invention. Various embodiments of the invention are directed to providing a power control device that substantially obviates one or more problems due to limitations and disadvantages of the related art. Moreover, embodiments of the invention relate to a technology for cutting off a path of unnecessary leakage current when power is ramped up in an integrated circuit (IC) having heterogeneous power, and stably controlling the operation of a level shifter. It is to be understood that both the foregoing general description and the following detailed description of the invention are explanatory and are intended to provide further explanation of the invention as claimed.

As the demand for higher-speed and higher-integration semiconductor devices is continuously increasing, an operation for correctly generating a voltage needed for internal components of the semiconductor device and efficiently distributing the voltage to the internal components of the semiconductor device is of importance.

Furthermore, multiple external power-supply voltages are used in a semiconductor memory device, such as a dynamic random access memory, used in mobile electronic systems such as a laptop computer, a Portable Multimedia Player (PMP), etc.

A high voltage needed for driving a word line or the like is generated using a first external power-supply voltage. DC power voltage of a peripheral circuit or a core circuit is generated using a second external power-supply voltage relatively lower than a first external power-supply voltage. In this case, efficiency in power distribution and various advantages can be provided.

A semiconductor memory device may include an internal power-supply voltage generator configured to generate an internal power-supply voltage needed for operating the device by reducing a relatively high-level voltage to a predetermined level. The semiconductor memory device may also include a reference voltage generator configured to generate a reference voltage needed for operating the internal power-supply voltage generator or the like. The semiconductor memory device may also include a boosting voltage (VPP) generator needed for applying the boosted voltage to a word line of a memory cell. In addition, the semiconductor memory device may include a level shifter configured to shift a first level voltage to a second level voltage.

The semiconductor memory device receives multiple power-supply voltages, and generates a voltage needed for internal components of the device. An undesirable leakage current path may be generated by a difference in power-up speed between multiple power-supply voltages, and a solution to the undesirable leakage current path is needed. When generation of a leakage current path is prevented, reliability of a voltage generation circuit contained in the semiconductor memory device is guaranteed so that power distribution can be more efficiently performed.

Referring to FIG. 1, a circuit diagram illustrating a power control device according to an embodiment of the invention is described.

In FIG. 1, the power control device according to an embodiment may be a level shifter. In this case, the level shifter may be implemented as a cross-coupled differential amplifier. The power control device may include an amplifier 100, an initialization unit 110, and a latch unit 120.

The amplifier 100 may include a plurality of PMOS transistors (P1~P4), a plurality of NMOS transistors (N1~N4), an inverter IV1, and a leakage current cut-off unit 130. The leakage current cut-off unit 130 may include an inverter IV2 and a NOR gate NOR1. The leakage current cut-off unit 130 may be configured to cut off a leakage current generated in the amplifier 100 during the initial power-up operation section.

A power-supply voltage VDD1 acting as the operation voltage is applied to source terminals of the PMOS transistors (P1, P2) and the inverter IV2. A power-supply voltage VDD2 acting as the operation voltage is applied to the NMOS transistors (N1, N2), the inverter IV1, and a NOR gate NOR2.

The PMOS transistors (P1, P3) and the NMOS transistors (N1, N3) are electrically coupled in series between the power-supply voltage (VDD1) input terminal and a ground voltage (VSS) terminal. The PMOS transistors (P2, P4) and the NMOS transistors (N2, N4) are electrically coupled in series between the power-supply voltage (VDD1) input terminal and the ground voltage (VSS) terminal.

The PMOS transistors (P1~P4) are cross-coupled to each other. The PMOS transistor P3 and the NMOS transistor N3 may receive an input signal INB through their gate terminals. The inverter IV1 outputs the input signal INB by inverting an input signal IN.

The PMOS transistor P4 and the NMOS transistor N4 may receive a drive control signal IND through their gate terminals. The NMOS transistor N1 and the NMOS transistor N2 may receive the power-supply voltage VDD2 through their gate terminals.

The inverter IV2 may invert a control signal (PWR_VDD1). The inverter IV2 may thus output the inverted control signal (PWR_VDD1). A NOR gate NOR1 may invert output signals of the input signal INB and the inverter IV2. The NOR gate NOR1 may thus output the drive control signal IND. The drive control signal IND may be of a logic low level to control a pull-down element irrespective of the control signal (PWR_VDD1). Further, the control signal (PWR_VDD1) may be at a logic high level before power-supply voltage VDD2 is ramped up after the power-supply voltage VDD1 has reached a predetermined target level.

The amplifier 100 may use the power-supply voltage VDD1 and the other power-supply voltage VDD2 that have different voltage levels. The amplifier 100 may perform level shifting of the power-supply voltage during an initial power-up operation. The amplifier 100 may output the level-shifted signal to the initialization unit 110. In this case, the amplifier 100 may perform level shifting of the power-supply voltage VDD2 such that the amplifier 100 may output the resultant signal shifted to the power-supply voltage (VDD1) level.

In this case, the power-supply voltage VDD1 may be a power-supply voltage supplied from a first power-supply voltage source. Further, the power-supply voltage VDD2 may be a power-supply voltage supplied from a second power-supply voltage source. The power-supply voltage VDD1 may be higher than the power-supply voltage VDD2.

As described above, the power control device according to an embodiment may perform level shifting of the input signal IN having the power-supply voltage (VDD2) level and the ground voltage (VSS) level to an output signal OUT having the power-supply voltage (VDD1) level and the ground voltage (VSS) level.

The initialization unit 110 may include a PMOS transistor P5 acting as a pull-up element. The PMOS transistor P5 is electrically coupled between the power-supply voltage (VDD1) input terminal and the output signal (A) input terminal of the amplifier 100. The PMOS transistor P5 also receives a control signal (PWR_VDD1) through a gate terminal. In this case, the control signal (PWR_VDD1) may be generated by detecting the power-supply voltage (VDD1) level.

In addition, the latch unit 120 may include PMOS transistors (P6, P7) acting as the pull-up elements and the inverter IV3. The PMOS transistors (P6, P7) are electrically coupled in series between the power-supply voltage (VDD1) input terminal and an output terminal of the output signal OUT.

The PMOS transistor P6 may receive the output signal OUT through a gate terminal. Further, the PMOS transistor P7 may receive the power-supply voltage (VDD2) through a gate terminal. The inverter IV3 may output the output signal OUT by inverting the output signal A. In this case, the inverter IV3 may receive the power-supply voltage VDD1 as the operation voltage.

Figure 2:
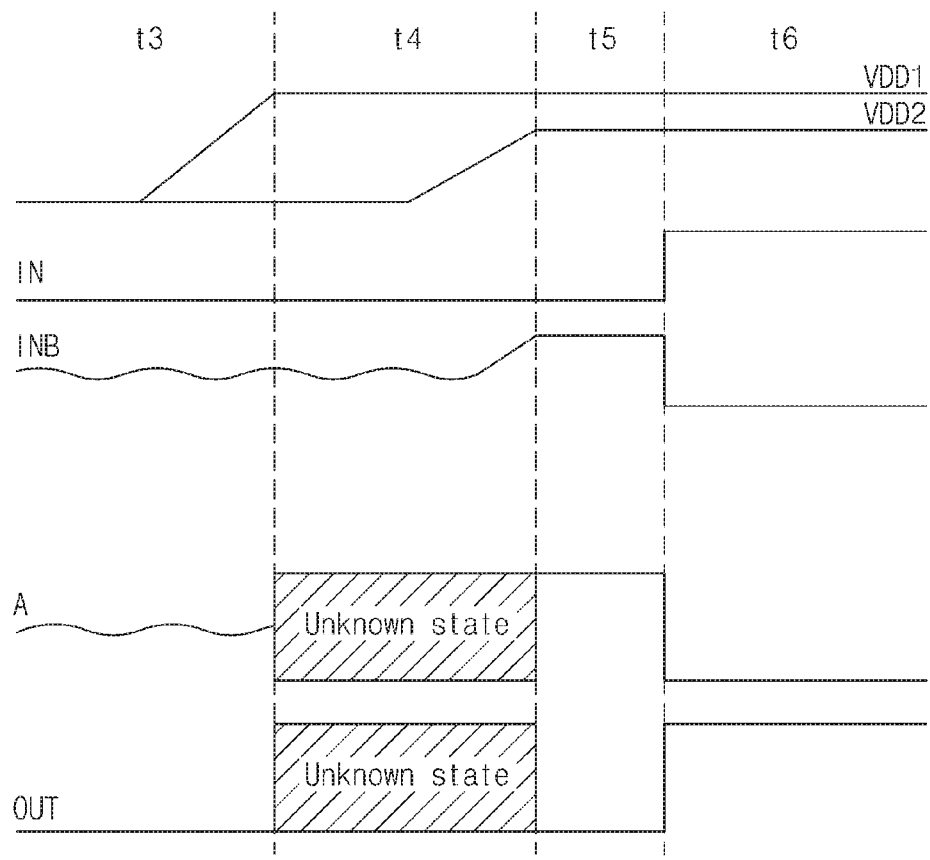
FIGS. 2 and 3 are conceptual diagrams illustrating the operations of a power control device according to an embodiment of the invention.
Figure 3:
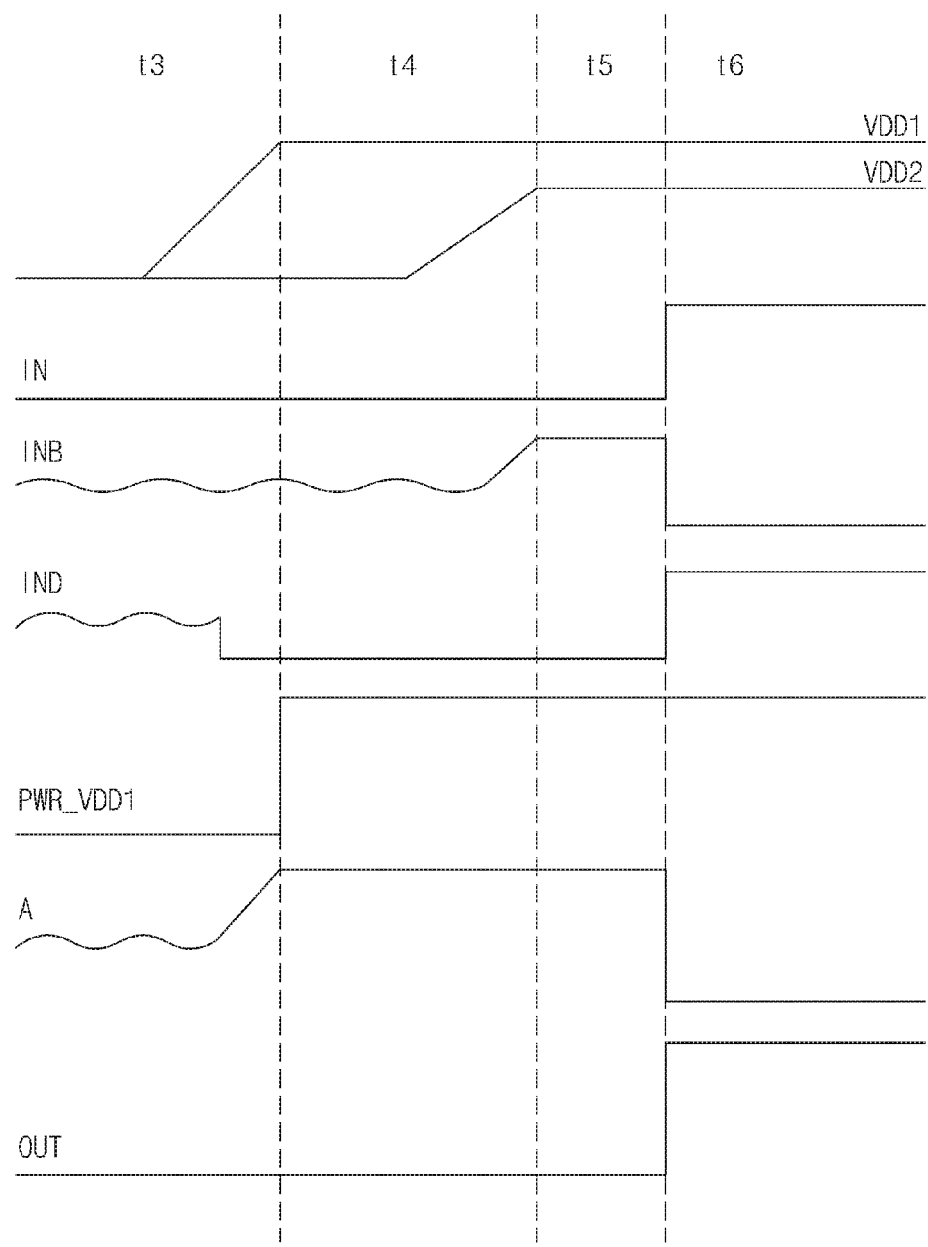

Referring to FIGS. 2 and 3, conceptual diagrams illustrating the operations of a power control device according to an embodiment of the invention are described.

In the case of the initial ramp-up operation, the power-supply voltage VDD1 gradually increases along a predetermined slope during a time section T3. After the power-supply voltage VDD1 reaches a target level, a predetermined voltage level is maintained during a time section T4. In the time section T4, the power-supply voltage VDD2 gradually increases along a predetermined slope.

In a time section T3, the input signal IN of the amplifier 100 is at a low level, and the input signal INB is at a high level. The NMOS transistor N3 and the PMOS transistor P2 are turned on. If the input signal INB is at a high level, the drive control signal IND corresponding to the output signal of the NOR gate NOR1 is at a low level irrespective of the control signal (PWR_VDD1).

As a result, a logic low level is applied to the PMOS transistor P4 such that the PMOS transistor P4 is turned on. Therefore, the output signal A of the amplifier 100 is level-shifted to the power-supply voltage (VDD1) level such that the level-shifted output signal A is output to the initialization unit 110.

If the output signal A of the amplifier 100 is at a low level, the output signal OUT is at a low level through the inverter IV3. The PMOS transistor P6 is turned on by the output signal OUT such that the output signal of the amplifier 100 is latched.

During the time sections (T3, T4) arranged before the power-supply voltage VDD2 is ramped up as shown in FIG. 2, the power-supply voltage VDD2 is maintained at 0V. During the time section T4 arranged before the power-supply voltage VDD2 is ramped up after the power-supply voltage VDD2 is ramped up, the power-supply voltage VDD2 is maintained at 0V.

The input signal INB of the amplifier 100 driven by the power-supply voltage VDD2 is floated. The drive control signal IND is floated such that an unstable state can be maintained.

Therefore, the output signal A of the amplifier 100 is floated such that it is impossible to recognize the output signal (OUT) level. If the input signal IN is at a low level, the input signal (INB) and the output signal (A) level are determined by parasitic capacitance charged in each node so that it is impossible to define an initial level.

During the time section T4, the power-supply voltage VDD1 reaches a target level, such that the output signal (A) of the amplifier 100 and the output signal (OUT) level may be changed. In this case, an internal power-supply voltage of an internal core region may not be set to a desired target level.

Therefore, as can be seen from FIG. 3, the output signal of the amplifier 100 is pulled up in response to the control signal (PWR_VDD1), and then latched. As a result, the output signal OUT is driven at a low level to prevent the occurrence of unnecessary leakage current. In addition, if the input signal INB is floated, the drive control signal IND is controlled at a low level so that a leakage current generated from the amplifier 100 can be cut off.

If the control signal PWR_VDD1 is at a low level during the initial power-up operation section T3, the PMOS transistor P5 is turned on such that the output signal A of the amplifier 200 is pulled up to the power-supply voltage (VDD1) level. If the input signal INB is floated, the output signal A of the amplifier 100 may be unstable.

However, while the control signal (PWR_VDD1) is at a low level, the initialization unit 110 is turned on so that the output signal A can be sufficiently driven at the power-supply voltage (VDD1) level. The output signal A is charged with the power-supply voltage (VDD1) level until the power-supply voltage VDD1 reaches a target level.

Accordingly, the PMOS transistor P5 outputs the output signal A having the power-supply voltage (VDD1) level to the latch unit 120 during a predetermined section in which the control signal PWR_VDD1 is at a low level. The latch unit 120 latches a high-level signal for a predetermined time, initializes the output signal to a low level, outputs the initialized output signal, and thus cuts off the path of a leakage current. In this case, a predetermined time in which the latch unit 120 latches the output signal of the PMOS transistor P5 may be extended to a time section arranged before the power-supply voltage VDD2 is ramped up.

If the control signal (PWR_VDD1) is at a low level, the drive control signal IND is unconditionally maintained at a low level. In this case, the NMOS transistor N4 remains off.

As a result, even when the output signal A is at a high level, an unnecessary leakage current capable of being generated in a ground voltage terminal through the NMOS transistors (N2, N4) can be cut off. In addition, the current racing of the amplifier 100 and the initialization unit 110 can be prevented from occurring.

Thereafter, since the power-supply voltage VDD2 is still at a low level during the time section T4, the input signal INB driven by the power-supply voltage VDD2 may be floated. However, if the power-supply voltage VDD1 is stabilized, the control signal (PWR_VDD1) may first transition to a high level.

In this case, the drive control signal IND may be unconditionally maintained at a low level such that the NMOS transistor N4 remains off. Accordingly, even when the output signal A is at a high level, unnecessary leakage current capable of being generated in a ground voltage terminal through the NMOS transistors (N2, N4) can be cut off.

In addition, if the power-supply voltage VDD2 is at a low level during the time section T4, the PMOS transistor P7 is turned on so as to operate the latch unit 120. As a result, the latch unit 120 may enable the output signal A to be sufficiently pulled up to the power-supply voltage (VDD1) level. Therefore, the output signal A is latched to the power-supply voltage (VDD1) level such that the output signal OUT of a low level is output.

As described above, according to an embodiment, during the initial power-up operation section, the output signal A of the amplifier 100 is initialized to a desired level. In addition, the leakage current generated from the pull-down stage of the amplifier 100 during the initial power-up operation section can be cut off.

Figure 4:
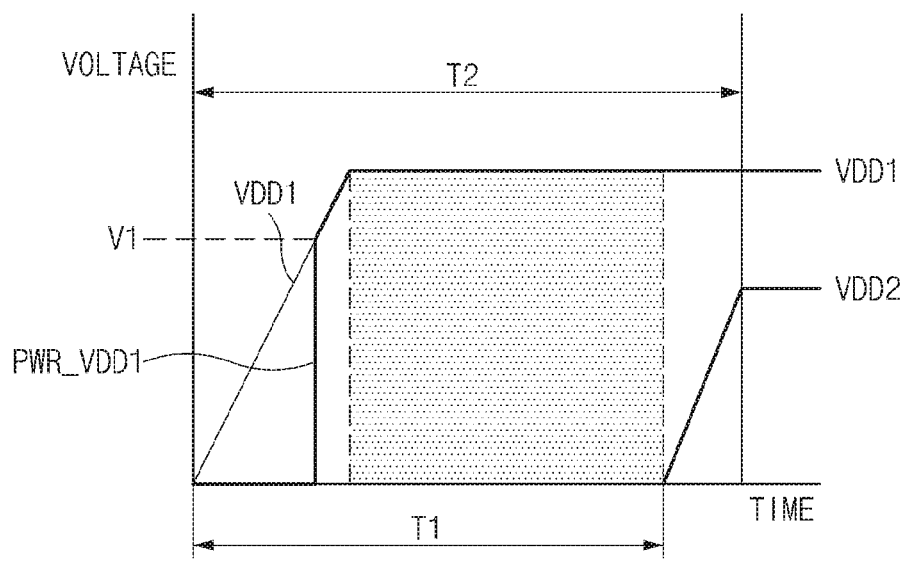
FIG. 4 is a conceptual diagram illustrating a control signal shown in FIG. 1.

The control signal (PWR_VDD1) is generated by detecting the power-supply voltage (VDD1) level. As can be seen from FIG. 4, if the power-supply voltage (VDD1) level is less than a specific voltage (V1) level, the control signal (PWR_VDD1) is at a low level. On the other hand, if the power-supply voltage (VDD1) level is higher than a specific voltage (V1) level, the control signal (PWR_VDD1) is at a high level such that the control signal (PWR_VDD1) moves along the power-supply voltage (VDD1) level.

Thereafter, during a time section T5, after the power-supply voltage (VDD2) reaches a target level, the power-supply voltage (VDD2) is maintained at a predetermined voltage level. Accordingly, the PMOS transistor P7 is turned off such that the latch unit 120 may operate as a driver without performing the latch operation after completion of the power-up operation. As a result, after completion of the power-up operation, the latch unit 120 is turned off so that the latch unit 120 does not affect speed characteristics of the level shifter.

Subsequently, during a time section T6, the input signal IN of the amplifier 100 is at a high level. If the input signal INB transitions to a low level, the PMOS transistor P3 is turned on. In this case, if the control signal (PWR_VDD1) is at a high level, the drive control signal IND transitions to a high level. Further, if the drive control signal IND is at a high level, the NMOS transistor N4 is turned on.

Therefore, the output signal A of the amplifier 100 is at a low level, and the output signal OUT is at a high level. Thus, the output signal A of the amplifier 100 and the output signal OUT may perform level shifting to the power-supply voltage VDD1 level. In this case, according to an embodiment, the output signal A is maintained at a high level during the time section T4 such that the output signal (OUT) level can be set to a stable high level.

As is apparent from the above description, the embodiments of the invention have the following effects.

The power control device according to the embodiments controls a stable operation of the device during the power-up operation section. The power control device also removes an operation deterioration factor of a level shifter after completion of the power-up operation.

The power control device can cut off a path of an unnecessary leakage current during a power ramp-up operation in an integrated circuit (IC) having heterogeneous power. The power control device can also reduce power consumption, and prevent the occurrence of a boot failure.

Figure 5:
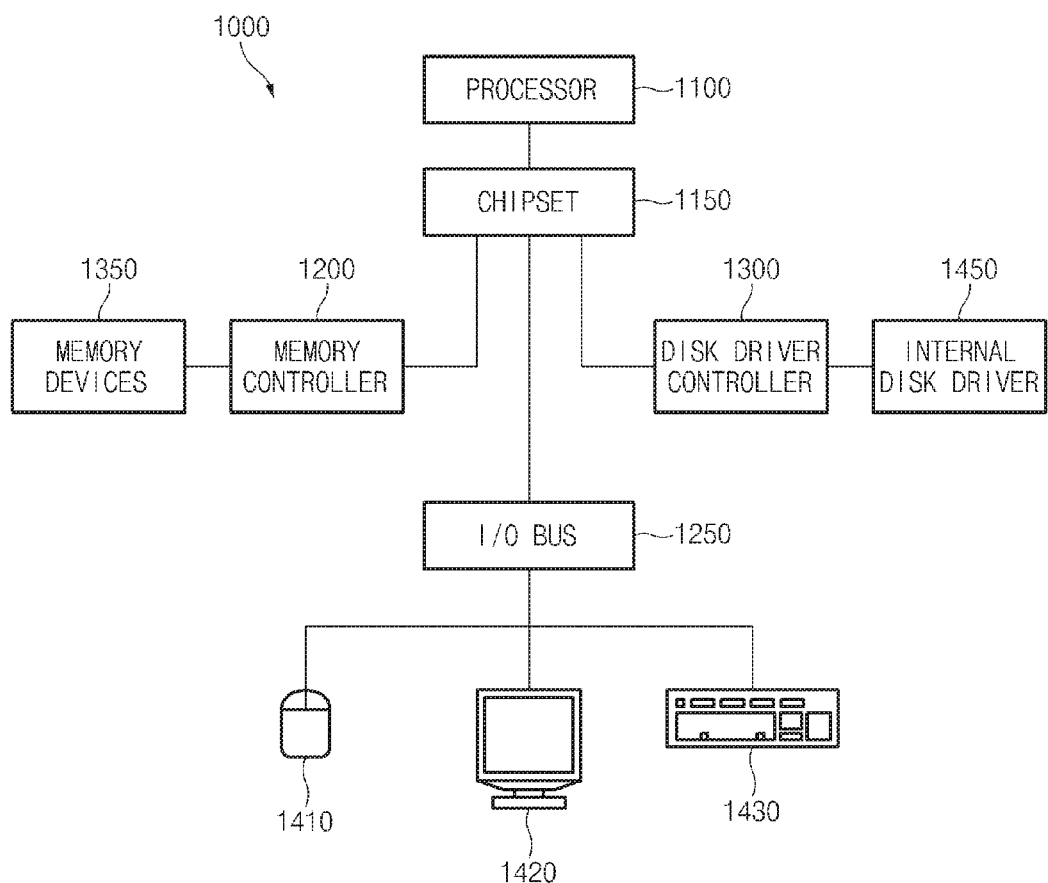
FIG. 5 illustrates a block diagram of a system employing a memory controller circuit in accordance with an embodiment of the invention.

The semiconductor devices and/or a power driving circuits discussed above (see FIGS. 1-4) are particular useful in the design of memory devices, processors, and computer systems. For example, referring to FIG. 5, a block diagram of a system employing a semiconductor device and/or a power driving circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the CPU 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or a power driving circuit as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or a power driving circuit as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a semiconductor device and/or a power driving circuit as discussed above with relation to FIGS. 1-4. In alternate embodiments, such as cellular phones or digital cameras, the components may differ from the embodiments illustrated in FIG. 5.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of invention. Particularly, numerous variations and modifications are possible in the component parts and/or arrangements which are within the scope of the invention, the figures and the accompanying claims. In addition to variations and modifications in the component parts and/or arrangements, alternative uses will also be apparent to those skilled in the art.

What is claimed is:

1. A power control device comprising:
   an amplifier configured to perform level shifting of a second power-supply voltage level to a first power-supply voltage level according to an input signal during an initial power-up operation section, and to output a level-shifted output signal;
   an initialization unit configured to set an output signal level of the amplifier to the first power-supply voltage level according to a control signal during the initial power-up operation section, and to output the first power-supply voltage level; and
   a latch unit configured to latch an output signal of the initialization unit according to the second power-supply voltage level during the initial power-up operation section.

2. The power control device according to claim 1, wherein the control signal is at a logic low level when the first power-supply voltage level is less than a specific level, and transitions to a logic high level when the first power-supply voltage level is equal to or higher than the specific level.

3. The power control device according to claim 1, wherein the initialization unit drives the output signal of the amplifier using the first power-supply voltage level according to the control signal changing in response to the first power-supply voltage level.

4. The power control device according to claim 1, wherein the initialization unit includes:
a first pull-up element electrically coupled between an input terminal of a first power-supply voltage and an output terminal of the amplifier, and configured to pull up the output terminal of the amplifier in response to the control signal.

5. The power control device according to claim 4, wherein the latch unit includes:
a second pull-up element controlled by the output signal, and configured to selectively provide the first power-supply voltage;
a third pull-up element electrically coupled between the second pull-up element and an output terminal of the initialization unit, and configured to be controlled by the first power-supply voltage; and
an inverter configured to output the output signal by inverting an output signal of the third pull-up element.

6. The power control device according to claim 1, wherein the latch unit maintains a latch state before the second power-supply voltage level is ramped up.

7. The power control device according to claim 1, wherein the latch unit is turned off when the second power-supply voltage level reaches a predetermined target level.

8. The power control device according to claim 1, wherein the latch unit is turned off when the initial power-up operation section is completed.

9. The power control device according to claim 1, wherein the latch unit latches the output signal of the initialization unit to the first power-supply voltage level when the second power-supply voltage is at a low level, and outputs the output signal of a low level.

10. The power control device according to claim 1, wherein a first power-supply voltage has a higher level than a second power-supply voltage.

11. The power control device according to claim 1, wherein a second power-supply voltage is ramped up after a first power-supply voltage is ramped up during the initial power-up operation section.

12. The power control device according to claim 1, wherein the amplifier further includes:
a leakage current cut-off unit configured to cut off a leakage current generated in the amplifier during the initial power-up operation section.

13. The power control device according to claim 12, wherein the leakage current cut-off unit outputs a drive control signal of a logic low level to control a pull-down element irrespective of the control signal when the input signal is at a low level.

14. The power control device according to claim 12,
wherein the leakage current cut-off unit outputs a drive control signal of a logic low level to control a pull-down element, when the control signal is at a low level during a ramp-up operation section of a first power-supply voltage,
wherein the leakage current cut-off unit outputs a drive control signal of a logic low level to control a pull-down element, when the control signal is at a high level before the second power-supply voltage level is ramped up after the first power-supply voltage has reached a predetermined target level.

15. The power control device according to claim 12, wherein the leakage current cut-off unit controls an output signal of the amplifier in response to a logic level of the input signal, when a first power-supply voltage and a second power-supply voltage are ramped up.

16. The power control device according to claim 12, wherein the leakage current cut-off unit includes:
an inverter configured to invert the control signal; and
a NOR gate configured to output a drive control signal for driving a pull-down element by performing a NOR operation between an output signal of the inverter and an inversion signal of the input signal.

17. A power control device comprising:
an amplifier configured to use a first power-supply voltage and a second power-supply voltage, perform a level shifting of the second power-supply voltage, and output a resultant signal shifted to a level of the first power-supply voltage;
an initialization unit including a pull-up element electrically coupled between an input terminal of the first power-supply voltage and an input terminal of the amplifier and configured to receive a control signal by detecting the level of the first power-supply voltage; and
a latch unit configured to latch an output signal of the initialization unit extended to a time section arranged before the second power-supply voltage is ramped up.

18. The power control device according to claim 17, wherein an output signal of the amplifier is driven at a low level.

19. The power control device according to claim 17, wherein the latch unit is configured to enable an output signal of the amplifier to be pulled up to the level of the first power-supply voltage.

20. The power control device according to claim 17, wherein the second power-supply voltage is maintained at a predetermined voltage level after reaching a target level at a specific time section.

* * * * *